(12) United States Patent
Akram et al.

(10) Patent No.: US 7,041,533 B1
(45) Date of Patent: May 9, 2006

(54) STEREOLITHOGRAPHIC METHOD FOR FABRICATING STABILIZERS FOR SEMICONDUCTOR DEVICES

(75) Inventors: Salman Akram, Boise, ID (US); Syed Sajid Ahmad, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 203 days.

(21) Appl. No.: 09/590,621

(22) Filed: Jun. 8, 2000

(51) Int. Cl.
*H01L 21/44* (2006.01)
*H01L 21/48* (2006.01)
*H01L 21/50* (2006.01)
*B29C 35/04* (2006.01)

(52) U.S. Cl. ............... 438/108; 438/125; 264/401

(58) Field of Classification Search ............... 438/108, 438/125; 264/401; 228/180.22
See application file for complete search history.

(56) References Cited

U.S. PATENT DOCUMENTS

| | | | |
|---|---|---|---|
| 3,811,186 A | | 5/1974 | Larnerd et al. |
| 3,871,015 A | * | 3/1975 | Lin et al. ............... 357/67 |
| 4,575,330 A | * | 3/1986 | Hull ............... 425/174.4 |
| 5,056,215 A | | 10/1991 | Blanton |
| 5,173,220 A | | 12/1992 | Reiff et al. |
| 5,220,200 A | | 6/1993 | Blanton |
| 5,264,061 A | * | 11/1993 | Juskey et al. ............... 156/214 |
| 5,278,442 A | | 1/1994 | Prinz et al. |
| 5,484,314 A | * | 1/1996 | Farnworth ............... 445/24 |
| 5,639,696 A | * | 6/1997 | Liang et al. ............... 437/209 |
| 5,700,715 A | | 12/1997 | Pasch |
| 5,705,117 A | | 1/1998 | O'Connor et al. |
| 5,870,220 A | * | 2/1999 | Migdal et al. ............... 359/216 |
| 6,046,910 A | * | 4/2000 | Ghaem et al. ............... 361/760 |
| 6,251,488 B1 | | 6/2001 | Miller et al. |
| 6,259,962 B1 | | 7/2001 | Gothait |
| 6,268,584 B1 | | 7/2001 | Keicher et al. |
| 6,271,598 B1 | * | 8/2001 | Vindasius et al. ............... 257/777 |
| 6,287,895 B1 | | 9/2001 | Sato |
| 6,326,698 B1 | | 12/2001 | Akram |
| 6,391,251 B1 | | 5/2002 | Keicher et al. |
| 6,410,366 B1 | | 6/2002 | Hashimoto |
| 6,461,881 B1 | | 10/2002 | Farnworth et al. |

(Continued)

FOREIGN PATENT DOCUMENTS

EP 463297 3/1991

(Continued)

OTHER PUBLICATIONS

Miller et al., "Maskless Mesoscale Materials Deposition", Deposition Technology, Sep. 2001, pp. 20-22.

(Continued)

*Primary Examiner*—Craig A. Thompson
*Assistant Examiner*—Nema Berezny
(74) *Attorney, Agent, or Firm*—TraskBritt

(57) ABSTRACT

One or more stabilizers are disposed on the surface of a semiconductor device component prior to bonding the same to a higher-level substrate. Upon assembly of the semiconductor device component face-down upon a higher-level substrate and joining conductive structures between the contact pads of the semiconductor device component and corresponding contact pads of the higher-level substrate, the stabilizers at least partially stabilize the semiconductor device component on the higher-level substrate to maintain a substantially parallel relation therebetween. The stabilizers can also be positioned and configured to define a minimum, substantially uniform distance between the semiconductor device component and the higher-level substrate. The stabilizers may be preformed structures or fabricated on the surface of the semiconductor device component, such as by way of a stereolithographic method.

40 Claims, 10 Drawing Sheets

U.S. PATENT DOCUMENTS

| | | |
|---|---|---|
| 6,506,671 B1 | 1/2003 | Grigg |
| 6,524,346 B1 * | 2/2003 | Farnworth .................. 634/763 |
| 6,525,408 B1 | 2/2003 | Akram et al. |
| 6,529,027 B1 * | 3/2003 | Akram et al. ............... 324/758 |
| 6,531,335 B1 * | 3/2003 | Grigg ......................... 438/106 |
| 6,544,821 B1 | 4/2003 | Akram |
| 6,548,897 B1 | 4/2003 | Grigg |
| 6,549,821 B1 * | 4/2003 | Farnworth et al. .......... 700/120 |
| 6,569,753 B1 | 5/2003 | Akram et al. |
| 6,630,365 B1 | 10/2003 | Farnworth et al. |
| 6,649,444 B1 | 11/2003 | Earnworth et al. |
| 6,740,962 B1 * | 5/2004 | Grigg ......................... 257/678 |
| 2002/0105074 A1 | 8/2002 | Akram et al. |
| 2002/0171177 A1 | 11/2002 | Kritchman et al. |
| 2003/0022462 A1 | 1/2003 | Farnworth et al. |
| 2003/0089999 A1 | 5/2003 | Akram |
| 2003/0092220 A1 | 5/2003 | Akram |
| 2003/0098499 A1 | 5/2003 | Akram et al. |
| 2003/0139030 A1 | 7/2003 | Grigg |
| 2003/0151167 A1 | 8/2003 | Kritchman et al. |
| 2003/0170921 A1 | 9/2003 | Akram |
| 2003/0173665 A1 | 9/2003 | Grigg |
| 2003/0176016 A1 | 9/2003 | Grigg |
| 2003/0203612 A1 | 10/2003 | Akram et al. |
| 2004/0047539 A1 | 3/2004 | Okubora et al. |

FOREIGN PATENT DOCUMENTS

| | | |
|---|---|---|
| JP | 57-176738 | 10/1982 |
| JP | 58-157146 | 9/1983 |
| JP | 1-238148 | 9/1989 |
| JP | 4-37137 | 2/1992 |
| JP | 4-62866 | 2/1992 |
| JP | 10189653 A * | 7/1998 |
| JP | 11-40608 | 2/1999 |
| JP | 11-214432 | 8/1999 |
| JP | 2000-77458 | 3/2000 |
| JP | 2000-299330 | 10/2000 |

OTHER PUBLICATIONS

Miller, "New Laser-Directed Deposition Technology", Microelectronic Fabrication, Aug. 2001, p. 16.

Webpage, Objet Prototyping the Future, Objet FullCure700 Series, 1 page.

Webpage, Objet Prototyping the Future, How it Works, 2 pages.

U.S. Appl. No. 09/590,527, filed Jun. 8, 2000, entitled "Structures For Stabilizing Semiconductor Devices Relative to Test Substrates and Methods for Fabricating the Stabilizers", inventor Salman Akram.

U.S. Appl. No. 10/201,208, filed Jul. 22, 2002, entitled "Thick Solder Mask for Confining Encapsulant Material Over Selected Locations of a Substrate, Assemblies Including the Solder Mask, and Methods", inventor Grigg et al.

U.S. Appl. No. 10/688,354, filed Oct. 17, 2003, entitled "Thick Solder Mask for Confining Encapsulant Material Over Selected Locations of a Substrate and Assemblies Including the Solder Mask", inventor Grigg et al.

* cited by examiner

STEREOLITHOGRAPHIC METHOD FOR FABRICATING STABILIZERS FOR SEMICONDUCTOR DEVICES

BACKGROUND OF THE INVENTION

1. Field of the Invention

The present invention relates generally to methods and structures for stabilizing a semiconductor device, such as a flip-chip type semiconductor die or a chip scale package (CSP), when disposed in face-down orientation over a carrier substrate, such as a circuit board. The stabilizer structures of the present invention are also useful for spacing a semiconductor device a substantially uniform desired distance away from the carrier substrate. More specifically, the invention pertains to stereolithographically fabricated stabilizers and to the use of stereolithographic methods to fabricate the stabilizers.

2. State of the Art

Flip-Chip Dice and Ball Grid Array Packages

Flip-chip technology, including chip scale packaging technology, is widely used in the electronics industry. In both the generic flip-chip and the chip scale packaging technologies, a semiconductor device having a pattern of conductive pads on an active surface thereof is joined face down to a higher-level substrate, such as a printed circuit board. The contact pads of the higher-level substrate are arranged in a mirror image to corresponding contact pads on the semiconductor device. Conductive structures, typically solder bumps (as exemplified by the so-called C-4 technology), conductive epoxy bumps or pillars, conductor-filled epoxy, or an anisotropically conductive z-axis elastomer, join contact pads on the surface of the semiconductor device with their corresponding contact pads on the higher-level substrate, establishing electrical communication between the semiconductor device and the higher-level substrate.

When the semiconductor device is a flip-chip type semiconductor die, the spacing or pitch between adjacent contact pads, or bond pads, is relatively small. The contact pads themselves are also very small. State of the art flip-chip type semiconductor dice typically include many contact pads in an array on the active surfaces thereof. The high density, small feature size, and large number of conductive pads on state-of-the-art semiconductor dice make the disposal of uniformly sized and configured conductive structures thereon a challenging process. Relatively small variations in the size or shape of the conductive structures can be accommodated for during bonding of the conductive structures to the contact pads of the higher-level substrate. However, due to larger dimensional variations in the conductive structures on flip-chip type semiconductor dice, higher bonding temperatures or compressive forces are typically required to ensure the formation of adequate bonds between the bond pads of a flip-chip type semiconductor die and the corresponding contact pads of a higher-level substrate. The use of higher temperatures can damage the circuitry and other features of the semiconductor die, as well as impair the integrity of the conductive structures. Overcompression of the conductive structures can also be detrimental. When a compressed conductive structure spreads over and contacts the glass (e.g., borophosphosilicate glass (BPSG), phosphosilicate glass (PSG), or borosilicate glass (BSG)) passivation layer that typically surrounds the bond pads of a semiconductor die, thermal cycling of the semiconductor die during subsequent processing or in use can fracture the conductive structure and diminish the electrical conductivity thereof.

FIG. 4 illustrates overflattened solder bumps 220A. Such overflattening may occur when solder bumps 220 are subjected to overly high temperatures, where there are an inadequate number of bumps (see below for further explanation), or when excessive weight or another compressive force 222, 224 is applied to die 200 to ensure the formation of adequate electrical connections between each bond pad 202 of die 200 and its corresponding contact pad 230 of a carrier substrate 210. Where flattened solder bump 220A extends laterally beyond bond pad 202 onto a surrounding glass passivation layer 236 or polymer overcoat, thermal cycling can crack the solder at locations overlying passivation layer 236 and disrupt the electrical continuity between bond pads 202 and their corresponding contact pads 230. It is also desirable to form solder connections with a minimum bump height for enhanced reliability, a relatively taller solder column providing a more reliable connection over time than a squat or flattened bump.

Moreover, some semiconductor dice have bond pads that are positioned in locations that will not adequately and stably support these dice when conductive structures are secured thereto and the dice are disposed face-down (i.e., in a flip-chip orientation) over a higher-level substrate. Examples of such dice include leads over chip (LOC)-configured semiconductor dice and semiconductor dice with one or two rows of bond pads along central axes of the dice with bond pads positioned adjacent only a single peripheral edge thereof. Thus, when conductive structures are secured to the bond pads of such a semiconductor die and the semiconductor die is then positioned face-down relative to a higher-level substrate, the die is prone to being tipped or tilted from an intended orientation that is substantially parallel to a plane of the contact pad-bearing surface of the higher-level substrate. As a consequence, such dice are thought to be unsuitable for flip-chip applications without rerouting of the bond pads to a more stable arrangement. In addition, one or two rows of bond pads bearing solder bumps may not exhibit sufficient surface tension during reflow of the solder to support the die, resulting in collapse or flattening of the masses of molten solder and shorts of adjacent connections. Inadequate support strength may also be a problem with other materials.

State of the art chip scale packages also have numerous densely packed features of small sizes and are, therefore, susceptible to many of the same connection problems described above in reference to other flip-chip type semiconductor dice.

FIG. 1 illustrates an LOC-configured semiconductor die 200 having two centrally located rows of bond pads 202 on an active surface 204 thereof. The two rows of bond pads 202 are located between opposite side edges 226 and 228 of die 200 and extend generally parallel to side edges 226 and 228. Die 200 can be flip-chip connected to a higher-level substrate, in this case a carrier substrate 210. Carrier substrate has contact pads 230 exposed at a surface 214 thereof. When die 200 is assembled with carrier substrate 210 in a flip-chip type arrangement, as shown in FIG. 2, die 200 is to be inverted relative to carrier substrate 210, with bond pads 202 being aligned with their corresponding contact pads 230.

Bond pads 202 are typically connected to their corresponding contact pads 230 by way of conductive structures disposed between bond pads 202 and contact pads 230. The conductive structures illustrated in FIGS. 1–7 are solder bumps 220. Typically, solder bumps 220 are first joined to bond pads 202, die 200 is then inverted relative to carrier substrate 210, and finally solder bumps 220 are secured to contact pads 230 by heating the solder to reflow, followed by cooling. As indicated in FIG. 2, the interposition of conductive bumps 220 between bond pads 202 and contact pads 230 ideally causes die 200 to be spaced apart from carrier substrate 210 a certain die-to-substrate distance 218.

As noted previously and illustrated in FIG. 3, bond pads 202 are arranged on active solder bumps 220 secured to bond pads 202. Alternatively, the conductive structures may be any other known type of conductive structure, suitably configured as balls, bumps, or pillars. The conductive structures can be formed from any type of conductive material or combination of materials known to be useful as a conductive structure of a semiconductor device, including, without limitation, solders, other metals, metal alloys, conductive epoxies, conductor filled epoxies, and z-axis conductive elements.

When tipping or tilting occurs before bond pads 202 and contact pads 230 are joined by solder bumps 220 or other conductive structures, if the angle at which die 200 tips or tilts relative to carrier substrate 210 is great enough, bond pads 202 in one of the rows can be lifted away from contact pads 230 by a sufficient distance to break electrical connections therebetween.

Tilting or tipping of die 200 relative to carrier substrate 210 prior to bonding solder bumps 220 or other conductive structures between bond pads 202 and contact pads 230 can also result in an assembly with conductive structures of different heights and thicknesses. For example, solder bumps 220 can form a variety of nonuniform joints, some of which are shorter and thicker, while other are taller and thinner, than desired. As is well known in the art, thermal stresses or inefficient thermal dissipation can cause failure of solder joints that are too short and thick or too tall and thin or of semiconductor devices joined by such solder joints. When a die 200 includes a combination of varied joints, the joints experience even greater stresses as die 200 heats and cools during operational cycling.

In addition, if die 200 tips or tilts too much relative to carrier substrate 210 prior to connecting bond pads 202 to contact pads 230, die 200 may contact carrier substrate 210 and cause an electrical short to occur.

If greater forces 222, 224 are applied to one edge 226, 228 of die 200 than to an opposite edge, 226, 228, thereof after bond pads 202 have been connected to their corresponding contact pads 230 by way of conductive structures such as solder bumps 220, one or more of the conductive structures may break, disrupting the electrical connection between one or more of bond pads 202 and their corresponding contact pads 230. In addition, the application of such stresses may cause die 200 itself to tilt or fracture. Tilting or tipping of die 200 may also adversely affect the electrical characteristics of a system of which die 200 is a part.

FIGS. 5, 6 and 7 illustrate that the same problems can occur with a die 200' or other semiconductor device having only a single, centrally located row of bond pads 202. While tilting or tipping of die 200' does not lift a row of solder bumps 220 from contact pads 230 of carrier substrate 210, the other problems discussed above in reference to the tipping or tilting of die 200 or flattening of conductive structures 220 may also occur when die 200' tips or tilts.

Thus, it is apparent that a need exists for a method and apparatus for adequately stabilizing a semiconductor device, such as a semiconductor die or chip scale package bearing few conductive structures and/or bearing conductive structures in an inherently unstable arrangement, when disposed face down over a higher-level substrate, such as a carrier substrate. There is also a need for a method and structure that facilitate spacing a semiconductor device face down over a higher-level substrate a substantially uniform distance and that facilitate the maintenance of conductive structures in desired shapes and dimensions following the connection of the semiconductor device to the higher-level substrate by way of the conductive structures.

Stereolithography

In the past decade, a manufacturing technique termed "stereolithography," also known as "layered manufacturing," has evolved to a degree where it is employed in many industries.

Essentially, stereolithography as conventionally practiced involves utilizing a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and non-metallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a partially consolidated, or semi-solid, state in those areas of a given layer corresponding to portions of the object, the consolidated or fixed material also at that time being substantially concurrently bonded to a lower layer. The unconsolidated material employed to build an object may be supplied in particulate or liquid form, and the material itself may be consolidated or fixed or a separate binder material may be employed to bond material particles to one another and to those of a previously-formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size, whereas when a liquid is employed, surface resolution is highly dependent upon the minimum surface area of the liquid which can be fixed and the minimum thickness of a layer that can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials, and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. It has also been recognized in some industries that a stereolithographic object or component may be formed or built around another, pre-existing object or component to create a larger product.

However, to the inventor's knowledge, stereolithography has yet to be applied to mass production of articles in volumes of thousands or millions, or employed to produce, augment or enhance products including other, pre-existing components in large quantities, where minute component sizes are involved, and where extremely high resolution and a high degree of reproducibility of results is required. In particular, the inventor is not aware of the use of stereolithography to fabricate stabilizer or stabilization structures for use on semiconductor devices, such as flip-chip type semiconductor devices or ball grid array packages. Furthermore, conventional stereolithography apparatus and methods fail to address the difficulties of precisely locating and orienting a number of pre-existing components for stereolithographic application of material thereto without the use of mechanical alignment techniques or to otherwise assuring precise, repeatable placement of components.

SUMMARY OF THE INVENTION

The present invention includes stabilizers, which are also referred to herein as spacers, as support structures, or as outriggers, that are positionable on a surface of a semiconductor device, such as on the active surface of a semiconductor die to be disposed face-down through use of projecting conductive structures over a higher-level substrate, as on the surface of a chip scale package from which conductive structures protrude. The stabilizers of the present invention may be used with semiconductor devices having bond pads arranged in such a manner that conductive structures, or elements, secured thereto will not adequately support the semiconductor device when disposed face down on a higher-level substrate.

Stabilizers incorporating teachings of the present invention are configured and located to, along with conductive structures, stabilize a semiconductor device when disposed face-down over a higher-level substrate.

The stabilizers of the present invention may also be configured to maintain a substantially parallel relation between a carrier substrate and a semiconductor device to be disposed in a face-down orientation over the carrier substrate. Stabilizers are also configured to space the semiconductor device and the carrier substrate a minimum distance apart from one another during and after the electrical connection of contact pads of the semiconductor device to corresponding contact pads of the carrier substrate. The stabilizers are configured to support the semiconductor device in spaced apart relation on the carrier substrate before, during, and after electrical connections are established between the semiconductor device and the carrier substrate.

The stabilizers of the present invention may be configured as linear structures of substantially uniform height or as columns, bumps, or structures of other shapes that have substantially uniform maximum heights. The height of the stabilizers on a semiconductor device is preferably less than or equal to the distance a conductive structure, such as a conductive bump, ball, or pillar, will extend between the plane of a surface of the semiconductor device and the plane of the facing surface of the carrier substrate upon which the semiconductor device is to be disposed.

While one or more linearly configured stabilizers support a semiconductor device disposed upon a carrier substrate by traversing a portion of a surface of the semiconductor device, stabilizers of other configurations are positioned at locations relative to the surface of the semiconductor device that will provide the desired level of stability. For example, the stabilizers can be positioned at or near the corners of the surface of the semiconductor device, at or near the edges of the semiconductor device, or in an array over the surface of the semiconductor device.

Preferably, the stabilizers of the present invention are also configured to permit an insulative underfill material to flow into the space between the semiconductor device and the carrier substrate while preventing the occurrence of air pockets or other voids in the underfill material.

The stabilizers can be fabricated directly on a substrate (e.g., the semiconductor device, a wafer including a plurality of semiconductor devices, or a carrier substrate) or initially fabricated separately from the substrate, then positioned in desired locations on the surface of the substrate and secured thereto. When the stabilizers of the present invention are fabricated on a semiconductor die, the stabilizers can be fabricated on a single die, a collection of individual, singulated dice, or on a wafer including a plurality of unsingulated dice. The stabilizers can similarly be fabricated on other substrates, either singly or collectively.

The stabilizers of the invention can be made by various known methods for fabricating features of semiconductor devices. By way of example and not limitation, mask and etch processes can be used to fabricate the stabilizers from dielectric materials, photoresist material can be patterned to form the stabilizers, or the stabilizers can be die cut from a layer of dielectric material. In a preferred embodiment of the invention, stereolithography, or layered manufacturing, processes are employed to fabricate the stabilizers.

The present invention preferably employs computer-controlled, 3-D CAD initiated, stereolithography techniques to fabricate the stabilizers of the present invention. When stereolithographic processes are employed, the stabilizers are each formed as either a single layer or a series of superimposed, contiguous, mutually adhered layers of material.

When the stabilizers are fabricated directly on a substrate by use of stereolithography, the stabilizers can be fabricated to extend to a given plane regardless of any irregularities on or nonplanarity of the surface of the semiconductor device on which the stabilizers are fabricated.

The stereolithographic method of fabricating the stabilizers of the present invention preferably includes the use of a machine vision system to locate the semiconductor devices on which the stabilizers are to be fabricated, as well as the features or other components on or associated with the semiconductor devices (e.g., lead frames, bond wires, solder bumps, etc.). A machine vision system is preferably used to direct the alignment of a stereolithography system with the substrate for material disposition purposes. Accordingly, the substrate need not be precisely mechanically aligned with respect to any component of the stereolithography system to practice the stereolithographic embodiment of the method of the present invention.

In a preferred embodiment, the stabilizers to be fabricated upon or positioned upon and secured to a substrate, such as a semiconductor die or chip scale package, in accordance with the invention are fabricated using precisely focused electromagnetic radiation in the form of an ultraviolet (UV) wavelength laser under control of a computer and responsive to input from a machine vision system, such as a pattern recognition system, to fix or cure selected regions of a layer of a liquid photopolymer material disposed on the substrate.

Other features and advantages of the present invention will become apparent to those of skill in the art through consideration of the ensuing description, the accompanying drawings, and the appended claims.

BRIEF DESCRIPTION OF THE DRAWINGS

The accompanying drawings illustrate exemplary embodiments of the invention, wherein some dimensions may be exaggerated for the sake of clarity, and wherein.

DETAILED DESCRIPTION OF THE INVENTION

Stabilizers

Figure 1:
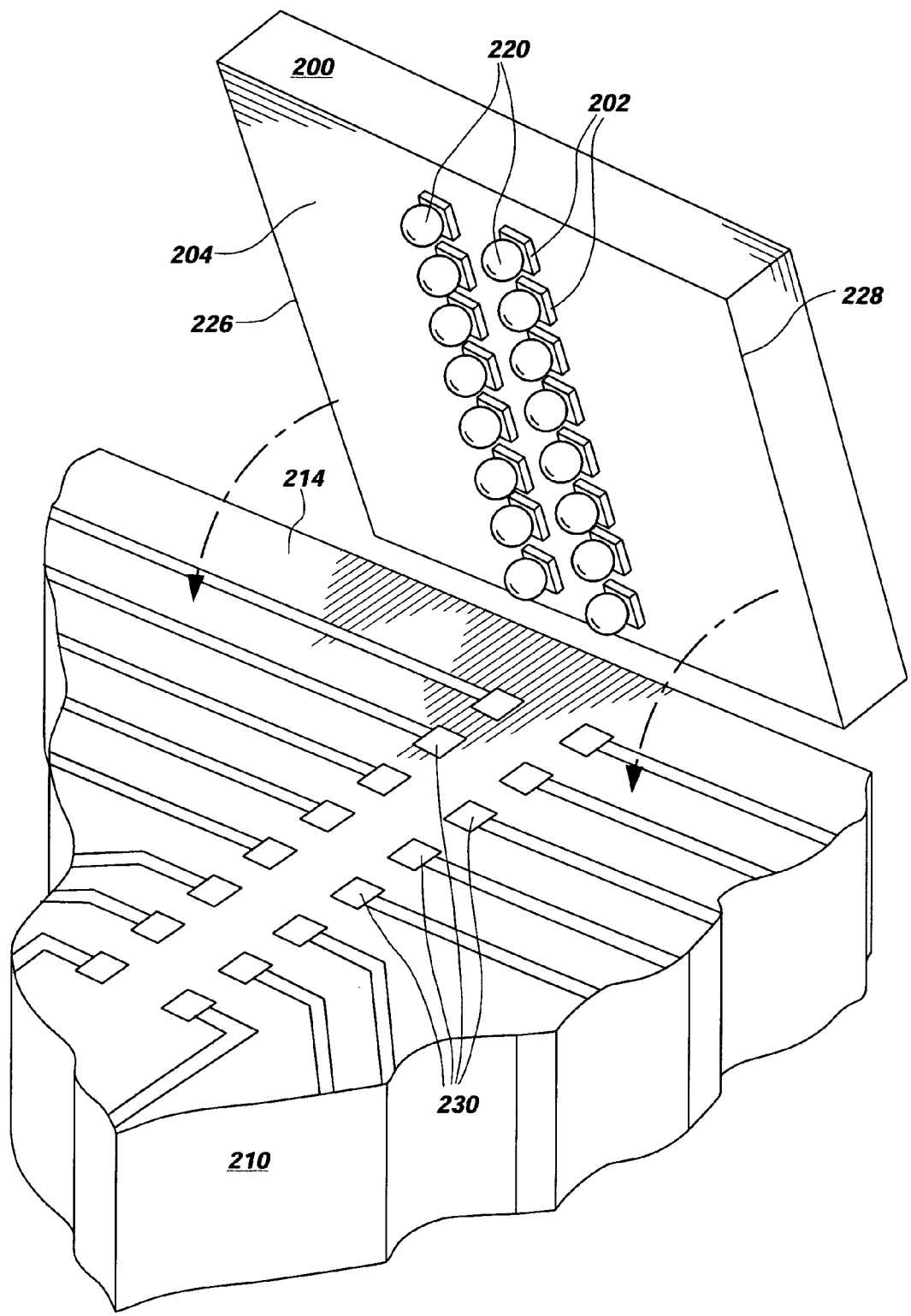
FIG. 1 is an enlarged perspective partial view of a semiconductor device positioned above a substrate upon which the semiconductor device is to be joined in a face-down orientation.
Figure 2:
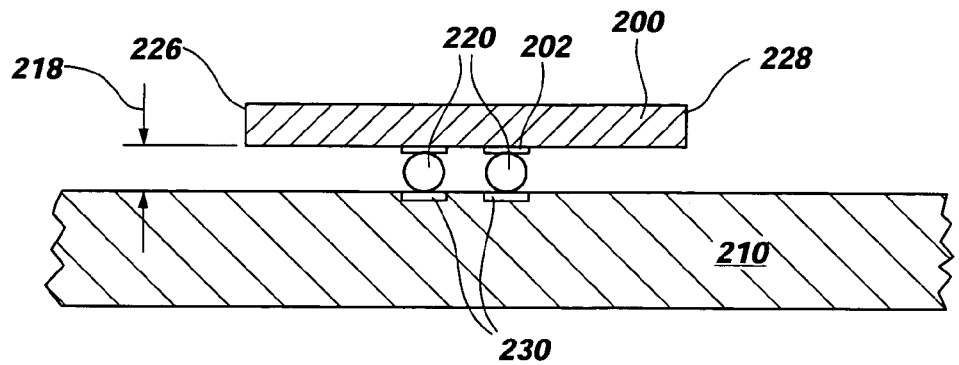
FIG. 2 is a cross-sectional view of an assembly including a semiconductor device disposed on a substrate in a face-down orientation.
Figure 3:
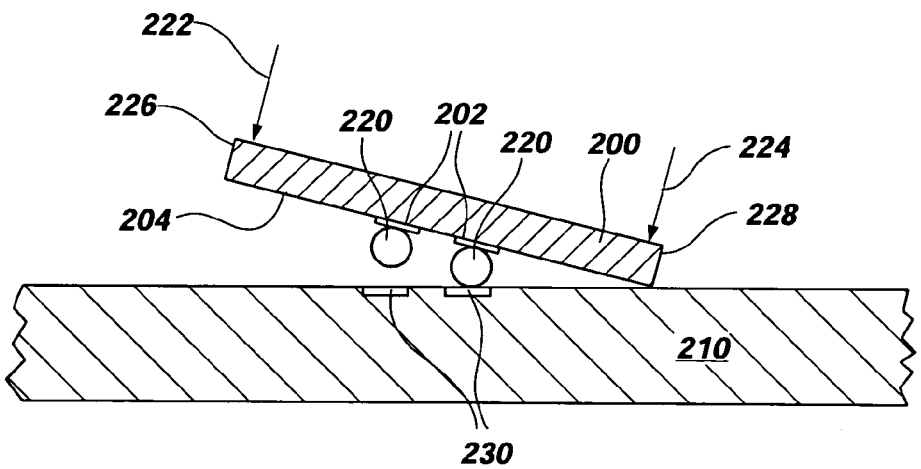
FIG. 3 is a cross-sectional view of the assembly of FIG. 2, with the semiconductor device being tipped or tilted relative to the substrate.
Figure 4:
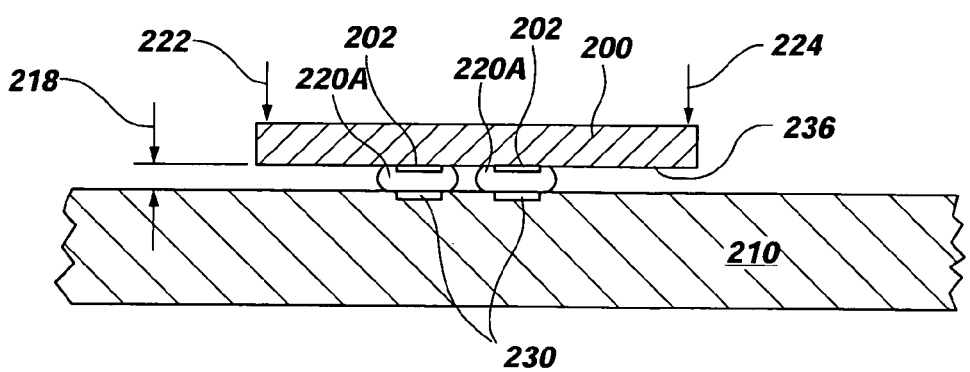
FIG. 4 is a cross-sectional view of the assembly of FIG. 2, illustrating overcompressed conductive structures joining the semiconductor device to the substrate.
Figure 5:
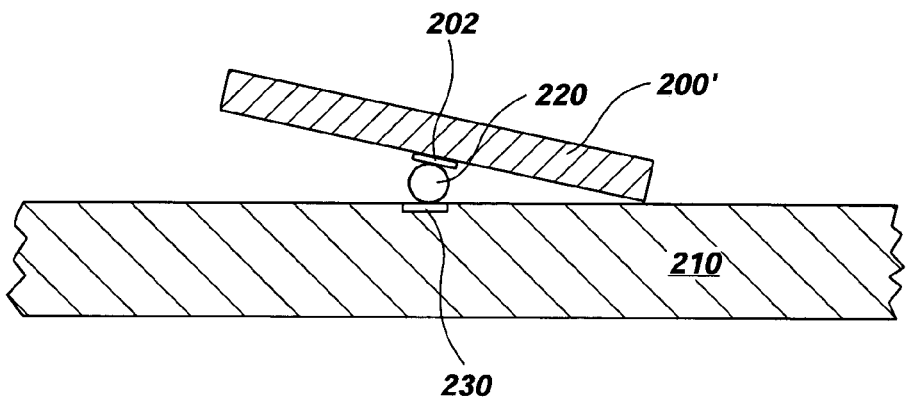
FIG. 5 is a cross-sectional view of an assembly including another semiconductor device disposed on a substrate in a face-down orientation, with the semiconductor device being tipped or tilted relative to the substrate.
Figure 6:
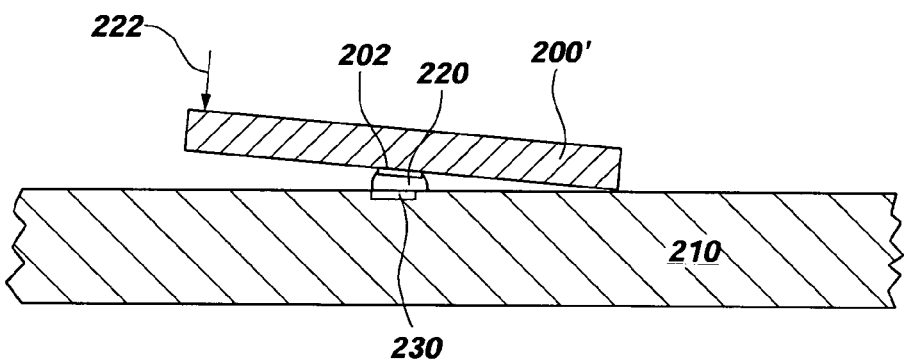
FIG. 6 is a cross-sectional view of the assembly of FIG. 5, illustrating the semiconductor device in a tipped or tilted position relative to the substrate and depicting an overcompressed conductive structure joining the semiconductor device to the substrate.
Figure 7:
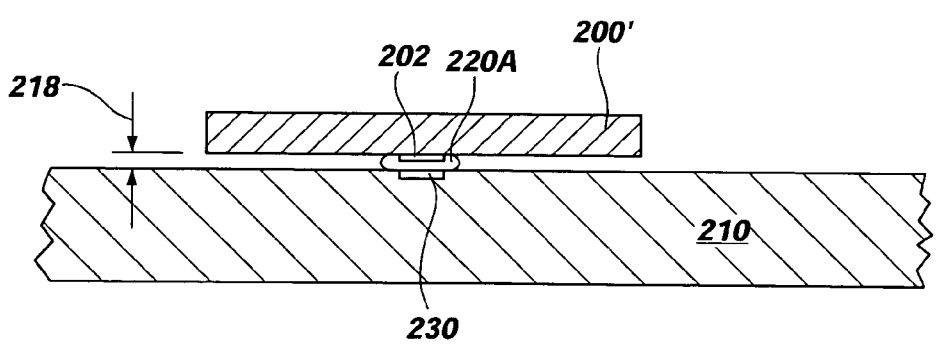
FIG. 7 is a cross-sectional view of the assembly of FIG. 5, illustrating an overcompressed conductive structure joining the semiconductor device to the substrate.
Figure 8:
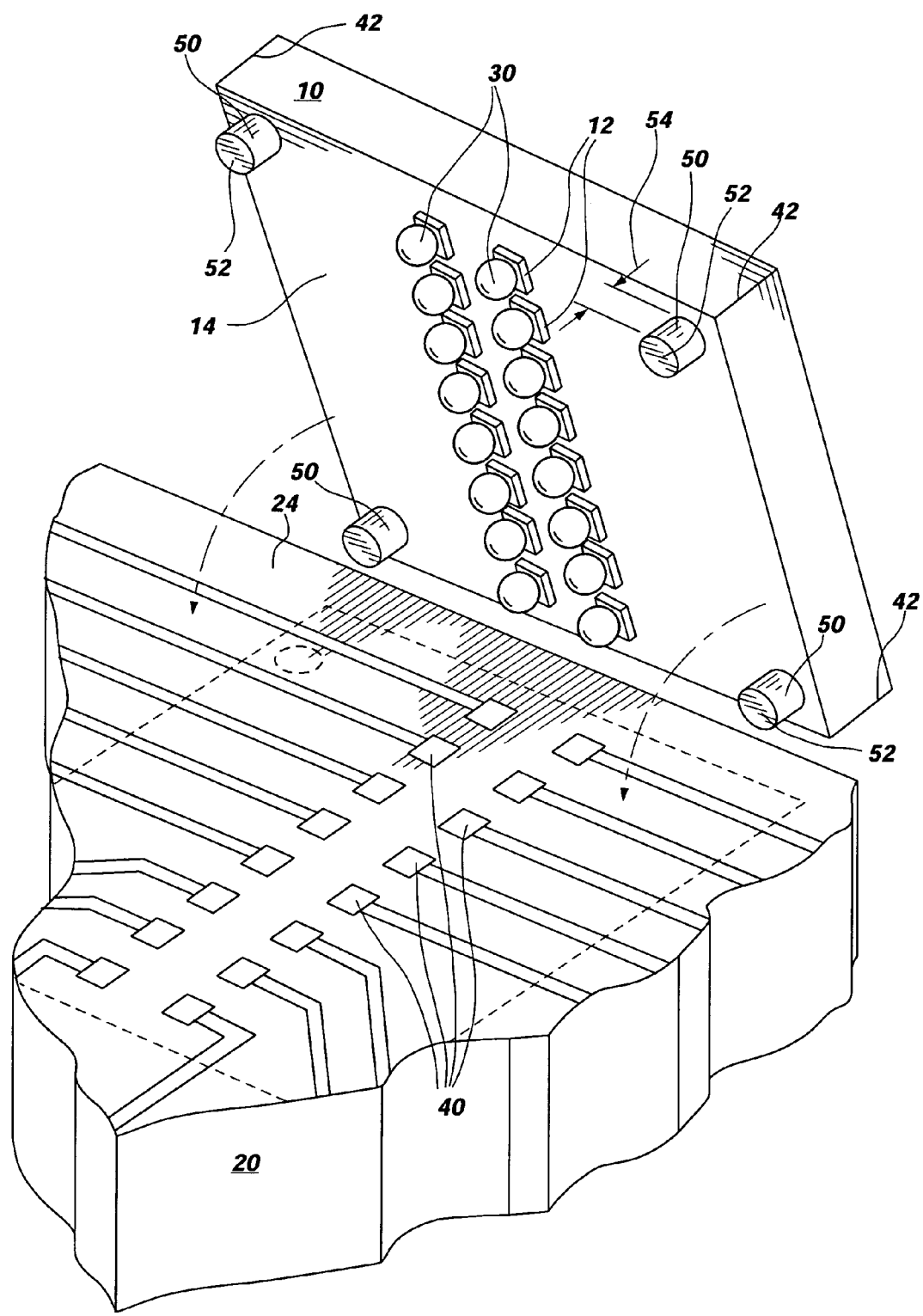
FIG. 8 is an enlarged partial perspective assembly view of a semiconductor device having stabilizers on a surface thereof, the semiconductor device being disposed on a substrate in a face-down orientation.
Figure 9:
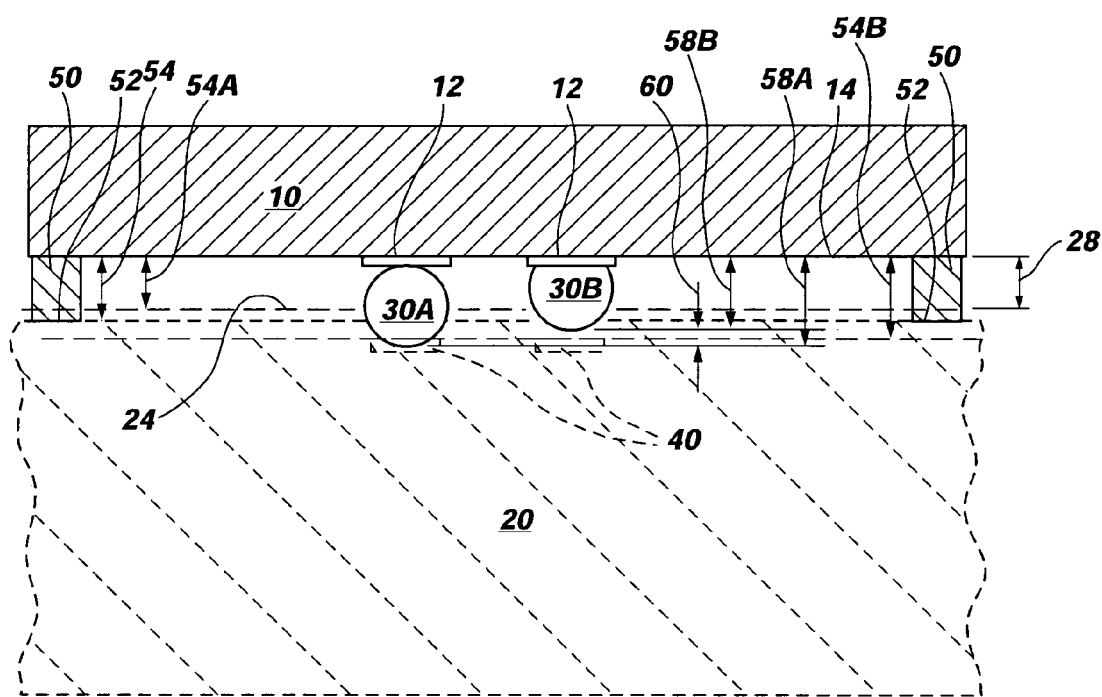
FIG. 9 is a cross-sectional view of an assembly with a semiconductor device disposed on a substrate in a face-down orientation, the semiconductor device including stabilizers to separate the surface of the semiconductor device a substantially uniform distance from the surface of the substrate.

FIGS. 8 and 9 illustrate the assembly of a semiconductor device 10 and a carrier substrate 20, with semiconductor device 10 being disposed on substrate 20 in a face-down, or inverted, orientation. Accordingly, semiconductor device 10 may be a LOC-configured semiconductor die being flip-chip bonded to substrate 20, a chip scale package being connected to substrate 20, or another type of semiconductor device that can be similarly disposed upon and bonded to substrate 20.

As depicted in FIG. 8, semiconductor device 10 has four stabilizers 50 protruding from an active surface 14 thereof. Stabilizers 50, which are also referred to herein as support structures, spacers, or outriggers, preferably protrude substantially equal distances from active surface 14 to a common plane. Stabilizers 50 are preferably configured and located so as to at least partially horizontally stabilize semiconductor device 10 when disposed face down over a higher-level substrate, such as substrate 20. Stabilizers 50 may be configured and positioned on semiconductor device 10 to horizontally stabilize semiconductor device 10 in combination with any conductive structures protruding therefrom.

FIGS. 8 and 9 also illustrate semiconductor device 10 as having conductive structures, or conductors, protruding from bond pads 12, such as the bond pads of a semiconductor die, exposed at active surface 14 thereof. The conductive structures are shown as solder bumps 30 secured to bond pads 12. Alternatively, the conductive structures may be any other known type of conductive structure, suitably configured as balls, bumps, or pillars. The conductive structures can be formed from any type of conductive material or combination of materials known to be useful as a conductive structure of a semiconductor device, including, without limitation, solders, other metals, metal alloys, conductive epoxies, conductor filled epoxies, and z-axis conductive elastomers.

Substrate 20 includes contact pads 40, such as the terminals of printed circuit board, exposed at a surface 24 thereof. Contact pads 40 are positioned to correspond to the arrangement of bond pads 12 of semiconductor device 10. Solder bumps 30 protruding from bond pads 12 are therefore located so as to contact corresponding contact pads 40 upon assembly of semiconductor device 10 and substrate 20 in the manner shown in FIGS. 8 and 9.

As shown in FIG. 9, different solder bumps 30 on semiconductor device 10 may protrude different distances from active surface 14. For example, solder bump 30A is shown as protruding from active surface 14 a distance 58A and bump 30B is shown as protruding from active surface 14 a distance 58B. When different solder bumps 30 protrude different distances from active surface 14 of semiconductor device 10, one or more solder bumps 30 may not adequately contact their corresponding contact pads 40 upon assembly of semiconductor device 10 and substrate 20, even after reflow. Moreover, differences in the distances that conductive bumps protrude from active surface 14 may cause active surface 14 to be non-parallel to surface 24 when semiconductor device 10 is invertedly disposed on substrate 20.

With continued reference to FIG. 9, stabilizers 50 that protrude too short a distance 54A from active surface 14 of semiconductor device 10 could cause conductive structures, such as solder bump 30A, to become overcompressed during bonding thereof between bond pad 12 and contact pad 40. Stabilizers 50 that protrude too great a distance 54B from active surface 14 of semiconductor device 10 could prevent shorter conductive structures, such as solder bump 30B, from establishing a reliable electrical connection between a bond pad 12 of semiconductor device and the corresponding contact pad 40 of substrate 20.

Thus, stabilizers 50 may each protrude from active surface 14 a distance 54 that is less than or equal to the distance 60 that conductive structures, such as solder bumps 30, including the shortest solder bump 30B, will protrude from active surface 14, or the distance conductive structures extend between active surface 14 and surface 24. Accordingly, stabilizers 50 will not prevent the shortest conductive structure, such as solder bump 30B, from contacting a contact pad 40 during bonding of a conductive structure, such as during thermally reflowing a solder bump 30, to contact pad 40.

If the conductive material of the conductive structures, such as solder bumps 30, will sag when reflowed, spacers 50 may protrude from active surface 14 a greater distance 54 than the distance 60 that conductive structures, such as solder bumps 30, protrude from active surface 14. Such sagging of the conductive material during reflow facilitates the formation of electrical connections between bond pads 12 and contact pads 40 even when stabilizers 50 are taller than the conductive structures. Thus, the use of taller stabilizers 50 may facilitate the formation of taller, thinner conductive structures.

When semiconductor device 10 and substrate 20 are assembled and bond pads 12 are bonding to corresponding contact pads 40 by way of solder bumps 30 or other conductive structures, stabilizers 50 maintain a substantially uniform distance between active surface 14 of semiconductor device 10 and surface 24 of substrate 20. Stabilizers 50 also horizontally stabilize semiconductor device 10 relative to substrate 20.

Moreover, distance 54 that stabilizers 50 protrude from active surface 14 is preferably great enough so that, upon bonding bond pads 12 of semiconductor device 10 to contact pads 40 exposed at surface 24 of substrate 20, a minimum, substantially uniform distance can be maintained between active surface 14 and surface 24. Distance 54 is also preferably great enough to prevent overcompression of any of solder bumps 30 or other conductive structures during bonding.

While semiconductor device 10 is illustrated in FIG. 8 as having four cylindrical stabilizers 50, one disposed adjacent each corner 42 of active surface 14, other numbers, arrangements, and configurations of stabilizers 50 are also within the scope of the present invention.

Referring again to FIG. 9, when semiconductor device 10 and substrate 20 are assembled, a contact surface 52 of each stabilizer 50 abuts, or is positioned in close proximity to, surface 24 of substrate. Contact surface 52 and the portion of each stabilizer 50 contacting active surface 14 are preferably sized and configured to spread any compressive forces applied to semiconductor device 10 or to substrate 20 over an expanded area of semiconductor device 10 or substrate 20. By spreading such compressive forces over larger areas of semiconductor device 10 or carrier substrate 20, damage to semiconductor device 10 or to substrate 20 that could otherwise be caused by such compressive forces can be prevented. Stabilizers 50 can also be arranged or positioned on active surface 14 so as to minimize the likelihood that compressive forces on semiconductor device 10 or substrate 20 will damage either semiconductor device 10 or substrate 20.

In addition, stabilizers 50 are configured to have sufficient strength and rigidity to maintain a substantially uniform minimum distance 28 between semiconductor device 10 and substrate 20 during the bonding of bond pads 12 of semiconductor device 10 to contact pads 40 of substrate 20. Stabilizers are also preferably configured to substantially maintain their configurations, dimensions, strength, and rigidity during any subsequent processing of the assembly of semiconductor device 10 and substrate 20, such as during the introduction of an underfill material therebetween, as well as during testing and normal operation of semiconductor device 10. Stabilizers 50 are also preferably configured to prevent tipping or tilting of semiconductor device 10 relative to substrate 20.

The configurations and locations of stabilizers 50 on active surface 14 preferably permit an underfill material having appropriate flow properties to flow into and fill the space between semiconductor device 10 and substrate 20 while preventing the occurrence of air pockets or other voids in the underfill material.

Figure 10:
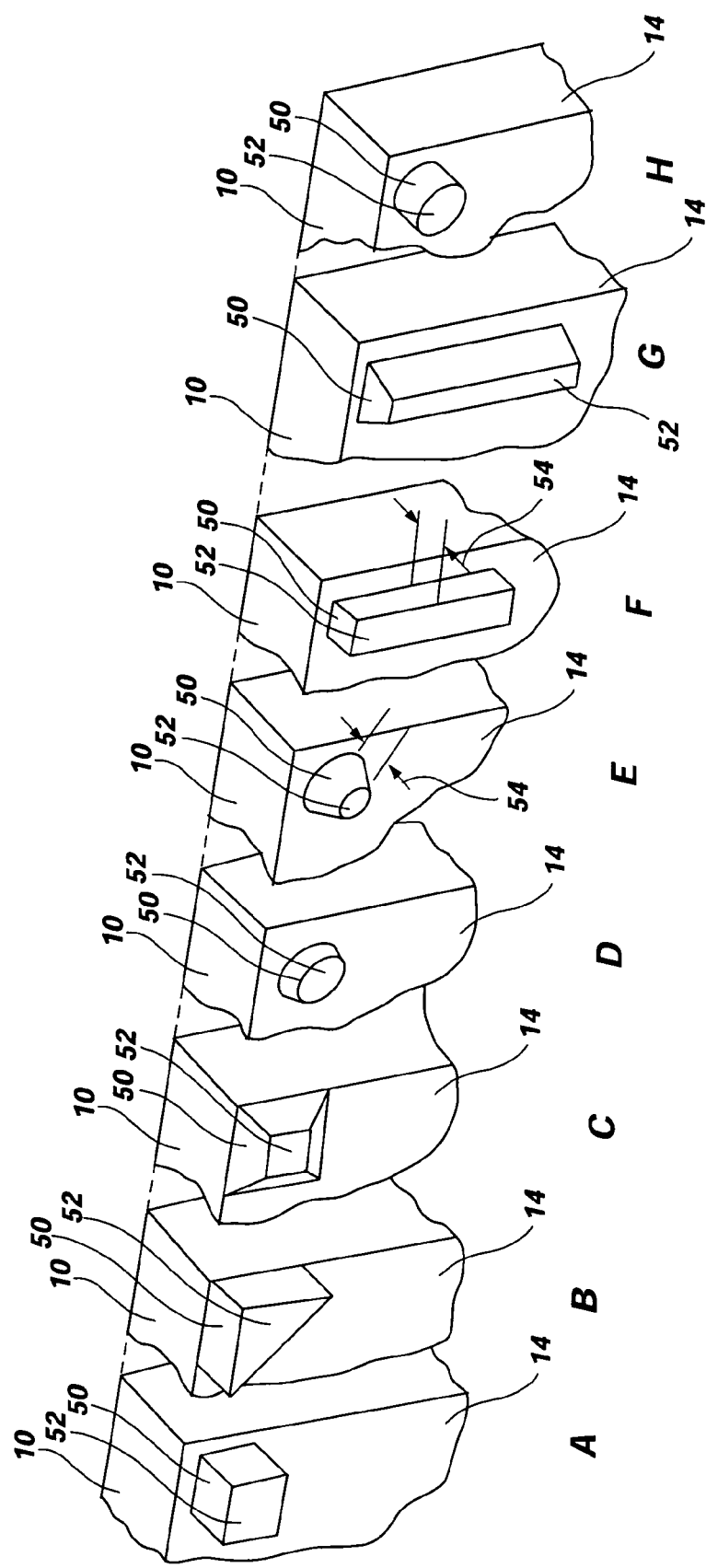
FIGS. 10(A)–10(H) are partial perspective views of semiconductor devices having differently configured stabilizers secured to a surface thereof.

Although stabilizers 50 are depicted in FIGS. 8 and 10(H) as each having a cylindrical shape, stabilizers 50 may alternatively be configured as pillars having a rectangular cross-section (FIG. 10(A)), pillars of triangular cross-section (FIG. 10(B)), truncated pyramids (FIG. 10(C)), truncated cones (FIG. 10(D)), truncated curved cones (FIG. 10(E)), and elongated strips (FIGS. 10(F) and 10(G)).

Figure 11:
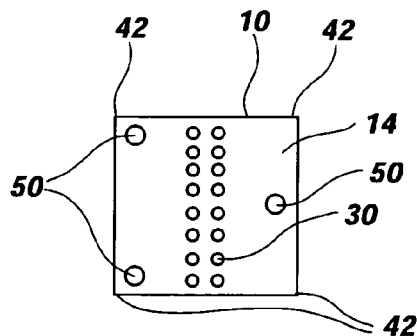
FIGS. 11–18 are plan views of semiconductor devices having stabilizers secured to the surfaces thereof in different locations.
Figure 15:
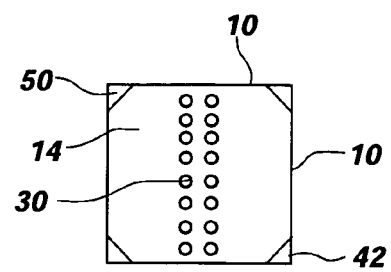
Figure 12:
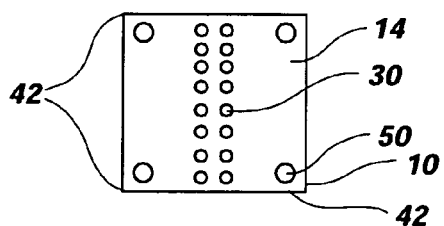
Figure 16:
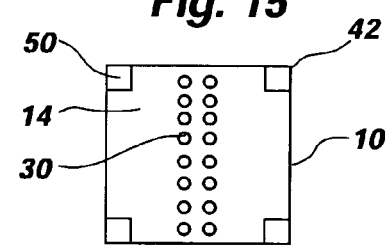
Figure 13:
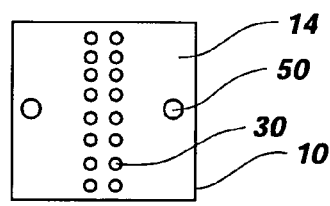
Figure 17:
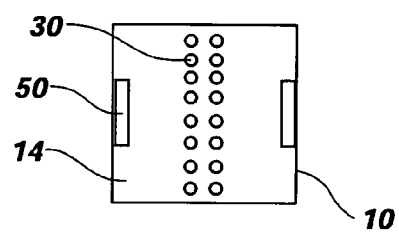
Figure 14:
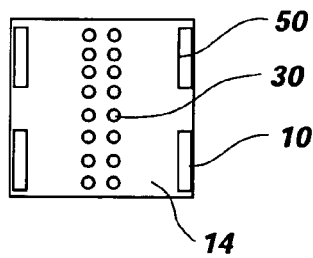
Figure 18:
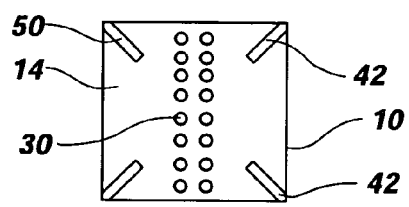
Figure 22:
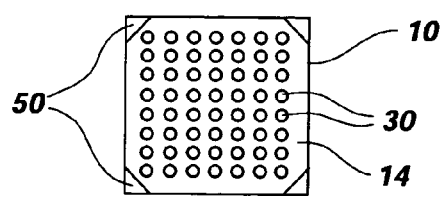
FIG. 22 is a plan view of a chip scale package type substrate, including conductive structures protruding from a surface thereof and stabilizers positioned on the surface.

By way of example, and not to limit the scope of the present invention, FIGS. 11–18 illustrate various exemplary arrangements of stabilizers 50 on active surface 14 of semiconductor device 10. In FIG. 11, two cylindrical stabilizers 50 are located near adjacent corners 42, and a third stabilizer is located between corners 42 on the opposite side of semiconductor device 10. In FIG. 12, a stabilizer 50 is located near each of the four corners 42 of active surface 14. Only two cylindrical stabilizers 50 are used in the embodiment of FIG. 13, each stabilizer 50 being positioned adjacent opposite peripheral edges of semiconductor device 10 on opposite sides of the centrally located rows of solder bumps 30. FIGS. 15 and 16 illustrate the use of stabilizers 50 with generally triangular and generally square cross-sections, respectively, positioned at corners 42 of active surface 14. In FIG. 14, four elongated stabilizers 50 are shown, two stabilizers 50 each being located adjacent to a portion of and parallel with one edge of semiconductor device and the other two stabilizers 50 being similarly located adjacent to the opposite peripheral edge of semiconductor device 10. FIGS. 17 and 18 illustrate other orientations of elongated stabilizers 50. In FIG. 17, the two elongated stabilizers 50 are positioned adjacent and parallel to opposite peripheral edges of semiconductor device 10. The four elongated stabilizers 50 depicted in FIG. 18 are positioned to extend from a location adjacent corners 42 diagonally toward the center of active surface 14 of semiconductor device 10.

As stabilizers 50 are illustrated as contacting active surface 14 of semiconductor device 10 and since stabilizers 50 can also contact surface 24 of substrate 20, stabilizers 50 are preferably fabricated from a dielectric material. In addition, the material from which stabilizers 50 are fabricated may preferably be readily formed to precise dimensions and secured to the surface of a substrate, such as a semiconductor die or other semiconductor device substrate. Examples of such materials include plastics, photoimageable resins, silicon dioxide, glass (e.g., borophosphosilicate glass ("BPSG"), phosphosilicate glass ("PSG"), borosilicate glass ("BSG")), and silicon nitride.

Figure 19:
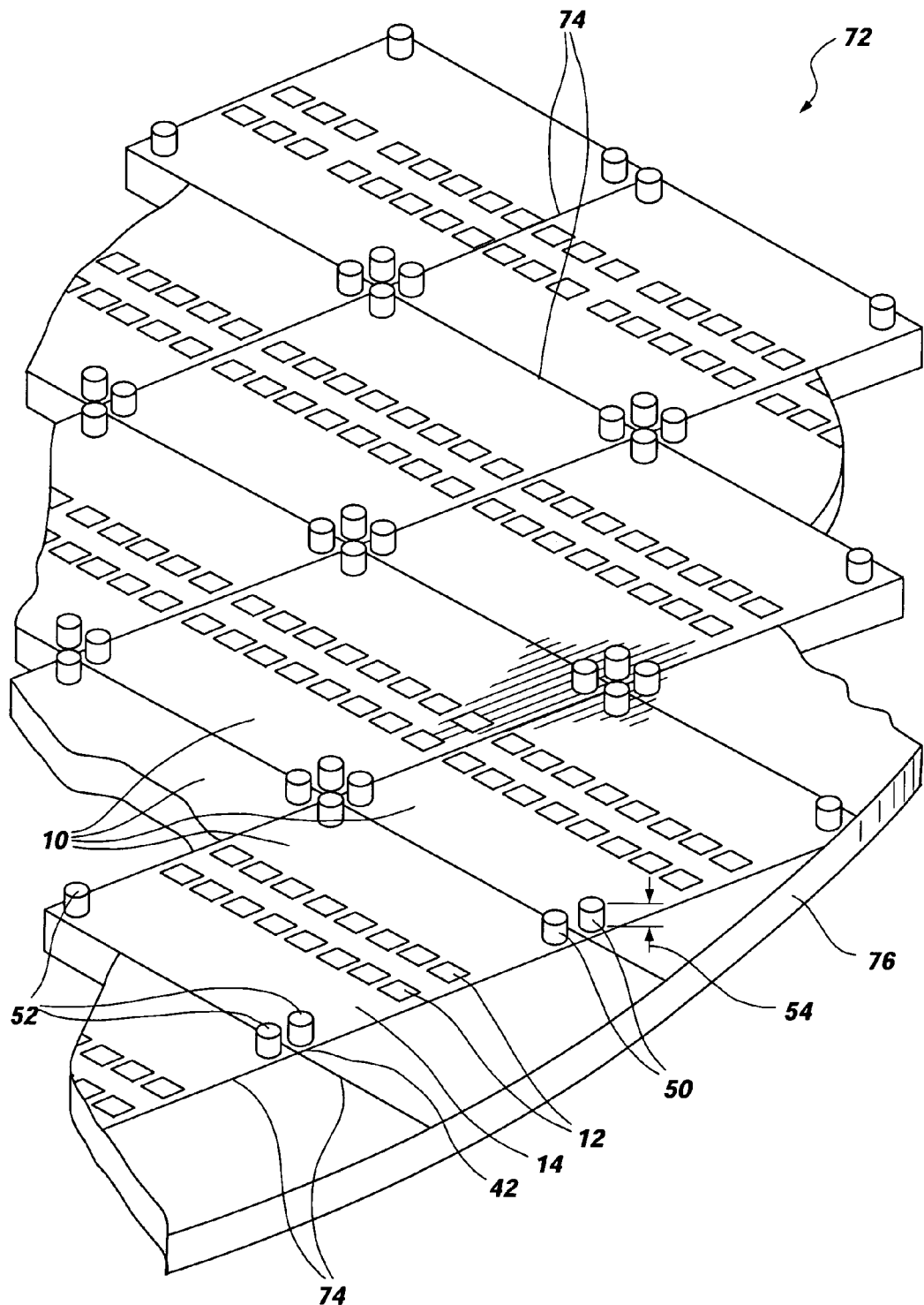
FIG. 19 is a perspective view of a portion of a semiconductor wafer having a plurality of semiconductor devices thereon, illustrating stabilizers being secured to the surfaces of the semiconductor devices at the wafer level.

As shown in FIG. 19, when semiconductor device 10 is a semiconductor die, stabilizers 50 may be fabricated or placed thereon prior to singulating the semiconductor die from a semiconductor wafer 72. As shown, a small portion of a semiconductor wafer 72 bounded by wafer edge 76 comprises a large number of semiconductor devices 10, which will be subsequently singulated, or separated, along scribe lines 74. Each semiconductor device 10 contains electrical circuits which terminate at bond pads 12 exposed at an active surface 14 of semiconductor device 10. In FIG. 19, cylindrical stabilizers 50 are positioned on active surface 14 adjacent a corner 42 thereof to protrude from active surface 14 a distance 54.

Methods of Fabricating Stabilizers

Several different processes can be used to fabricate stabilizers 50 in accordance with teachings of the present invention. As an example, stabilizers 50 can be preformed from plastic, epoxy or other resins by known processes, such as by molding or micromachining processes. These stabilizers 50 are then secured to the surface of a semiconductor device 10 by known processes, such as by the use of adhesive.

As another example, stabilizers 50 can be fabricated on the active surface 14 of a semiconductor device 10 by applying a layer of insulative material onto active surface 14 of semiconductor device 10 (e.g., by known deposition processes such as chemical vapor deposition ("CVD") or spin-on-glass ("SOG") processes) followed by removing unwanted portions of the layer, (e.g., by use of photomask and etch processes).

In yet another example of a method that can be used to fabricate stabilizers 50, a photoresist material is applied to active surface 14 of semiconductor device 10. The photoresist is then masked, exposed, and developed to form stabilizers 50 in desired locations on active surface 14.

Stereolithographic processes are also useful for forming stabilizers 50. When stereolithographic processes are used, stabilizers 50 can have one or more layers of at least partially consolidated material. Stereolithographic processes can be used to fabricate stabilizers 50 can be fabricated in situ on semiconductor device 10 or separately therefrom.

Of the above methods, the stereolithographic process is currently the preferred embodiment of the method of the present invention and will, therefore, be discussed at length.

Stereolithography Apparatus and Methods

Figure 20:
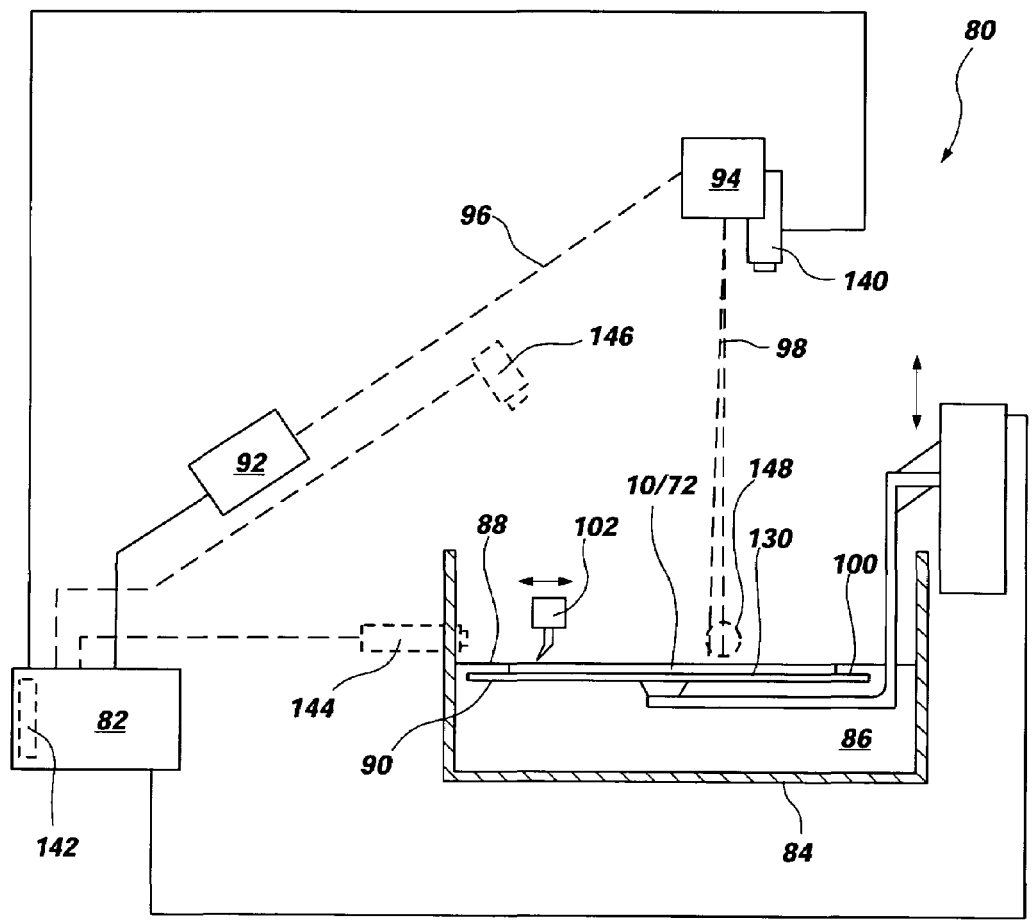
FIG. 20 is a schematic representation of an exemplary stereolithography apparatus that can be employed in the method of the present invention to fabricate the stabilizers of the present invention.

FIG. 20 schematically depicts various components, and operation, of an exemplary stereolithography apparatus 80 to facilitate the reader's understanding of the technology employed in implementation of the stereolithography embodiment of the method of the present invention, although those of ordinary skill in the art will understand and appreciate that apparatus of other designs and manufacture may be employed in practicing the method of the present invention. The preferred, basic stereolithography apparatus for implementation of the method of the present invention, as well as operation of such apparatus, are described in great detail in United States patents assigned to 3D Systems, Inc. of Valencia, Calif., such patents including, without limitation, U.S. Pat. Nos. 4,575,330; 4,929,402; 4,996,010; 4,999, 143; 5,015,424; 5,058,988; 5,059,021; 5,059,359; 5,071, 337; 5,076,974; 5,096,530; 5,104,592; 5,123,734; 5,130, 064; 5,133,987; 5,141,680; 5,143,663; 5,164,128; 5,174, 931; 5,174,943; 5,182,055; 5,182,056; 5,182,715; 5,184, 307; 5,192,469; 5,192,559; 5,209,878; 5,234,636; 5,236, 637; 5,238,639; 5,248,456; 5,256,340; 5,258,146; 5,267, 013; 5,273,691; 5,321,622; 5,344,298; 5,345,391; 5,358, 673; 5,447,822; 5,481,470; 5,495,328; 5,501,824; 5,554, 336; 5,556,590; 5,569,349; 5,569,431; 5,571,471; 5,573, 722; 5,609,812; 5,609,813; 5,610,824; 5,630,981; 5,637, 169; 5,651,934; 5,667,820; 5,672,312; 5,676,904; 5,688, 464; 5,693,144; 5,695,707; 5,711,911; 5,776,409; 5,779, 967; 5,814,265; 5,850,239; 5,854,748; 5,855,718; 5,855, 836; 5,885,511; 5,897,825; 5,902,537; 5,902,538; 5,904, 889; 5,943,235; and 5,945,058. The disclosure of each of the foregoing patents is hereby incorporated herein by this reference.

With reference again to FIG. 20 and as noted above, a 3-D CAD drawing of an object to be fabricated in the form of a data file is placed in the memory of a computer 82 controlling the operation of apparatus 80, if computer 82 is not a CAD computer in which the original object design is effected. In other words, an object design may be effected in a first computer in an engineering or research facility and the data files transferred via wide or local area network, tape, disc, CD-ROM, or otherwise as known in the art to computer 82 of apparatus 80 for object fabrication.

The data is preferably formatted in an STL (for STereoLithography) file, STL being a standardized format employed by a majority of manufacturers of stereolithography equipment. Fortunately, the format has been adopted for use in many solid-modeling CAD programs, so often translation from another internal geometric database format is unnecessary. In an STL file, the boundary surfaces of an object are defined as a mesh of interconnected triangles.

Apparatus 80 also includes a reservoir 84 (which may comprise a removable reservoir interchangeable with others containing different materials) of liquid material 86 to be employed in fabricating the intended object. In the currently preferred embodiment, the liquid is a photo-curable polymer, or "photopolymer," that cures in response to light in the UV wavelength range. The surface level 88 of material 86 is automatically maintained at an extremely precise, constant magnitude by devices known in the art responsive to output of sensors within apparatus and preferably under control of computer 82. A support platform or elevator 90, precisely vertically movable in fine, repeatable increments responsive to control of computer 82, is located for movement downward into and upward out of material 86 in reservoir 84.

An object may be fabricated directly on platform 90, or on a substrate disposed in platform 90. When the object is to be fabricated on a substrate disposed on platform 90, the substrate may be positioned on platform 90 and secured thereto by way of one or more base supports 122. Such base supports 122 may be fabricated before or simultaneously with the stereolithographic fabrication of one or more objects on platform 90 or a substrate disposed thereon. These supports 122 may support, or prevent lateral movement of, the substrate relative to a surface 100 of platform 90. Supports 122 may also provide a perfectly horizontal reference plane for fabrication of one or more objects thereon, as well as facilitate the removal of a substrate from platform 90 following the stereolithographic fabrication of one or more objects on the substrate. Moreover, where a so-called "recoater" blade 102 is employed to form a layer of material on platform 90 or a substrate disposed thereon, supports 122 can preclude inadvertent contact of recoater blade 102, to be described in greater detail below, with surface 100 of platform 90.

Apparatus 80 has a UV wavelength range laser plus associated optics and galvanometers (collectively identified as laser 92) for controlling the scan of laser beam 96 in the X-Y plane across platform 90 has associated therewith mirror 94 to reflect beam 96 downwardly as beam 98 toward surface 100 of platform 90. Beam 98 is traversed in a selected pattern in the X-Y plane, that is to say in a plane parallel to surface 100, by initiation of the galvanometers under control of computer 82 to at least partially cure, by impingement thereon, selected portions of material 86 disposed over surface 100 to at least a semi-solid state. The use of mirror 94 lengthens the path of the laser beam, effectively doubling same, and provides a more vertical beam 98 than would be possible if the laser 92 itself were mounted directly above platform surface 100, thus enhancing resolution.

Figure 21:
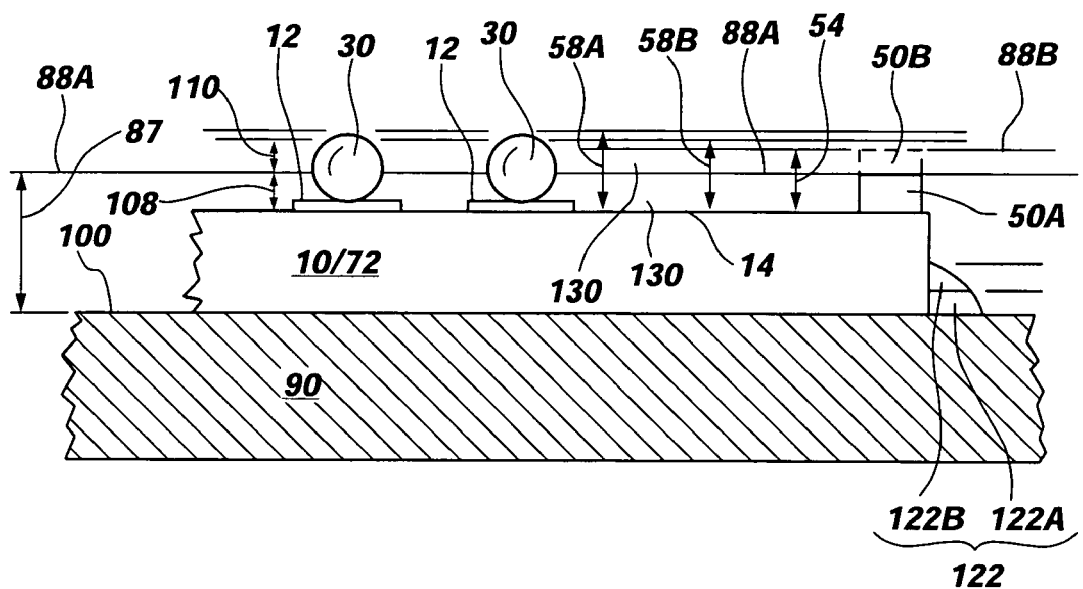
FIG. 21 is a partial cross-sectional side view of a semiconductor die disposed on a platform of a stereolithographic apparatus for the formation of stabilizers on the die.

Referring now to FIGS. 20 and 21, data from the STL files resident in computer 82 is manipulated to build an object, such as stabilizers 50, illustrated in FIGS. 8–19 and 22, or base supports 122, one layer at a time. Accordingly, the data mathematically representing one or more of the objects to be fabricated are divided into subsets, each subset representing a slice or layer of the object. The division of data is effected by mathematically sectioning the 3-D CAD model into at least one layer, a single layer or a "stack" of such layers representing the object. Each slice may be from about 0.0001 to about 0.0300 inch thick. As mentioned previously, a thinner slice promotes higher resolution by enabling better reproduction of fine vertical surface features of the object or objects to be fabricated.

When one or more base supports 122 are to be stereolithographically fabricated, supports 122 may be programmed as a separate STL file from the other objects to be fabricated. The primary STL file for the object or objects to be fabricated and the STL file for base support(s) 122 are merged.

Before fabrication of a first layer for a support 122 or an object to be fabricated is commenced, the operational parameters for apparatus 80 are set to adjust the size (diameter if circular) of the laser light beam used to cure material 86. In addition, computer 82 automatically checks and, if necessary, adjusts by means known in the art, the surface level 88 of material 86 in reservoir 84 to maintain same at an appropriate focal length for laser beam 98. U.S. Pat. No. 5,174,931, referenced above and previously incorporated herein by reference, discloses one suitable level control system. Alternatively, the height of mirror 94 may be adjusted responsive to a detected surface level 88 to cause the focal point 148 of laser beam 98 to be located precisely at the surface of material 86 at surface level 88 if level 88 is permitted to vary, although this approach is more complex. Platform 90 may then be submerged in material 86 in reservoir 84 to a depth equal to the thickness of one layer or slice of the object to be formed, and the liquid surface level 88 is readjusted as required to accommodate material 86 displaced by submergence of platform 90. Laser 92 is then activated so laser beam 98 will scan unconsolidated (e.g., liquid or powdered) material 86 disposed over surface 100 of platform 90 to at least partially consolidate (e.g., polymerize to at least a semisolid state) material 86 at selected locations, defining the boundaries of a first layer 122A of base support 122 and filling in solid portions thereof. Platform 90 is then lowered by a distance equal to thickness of second layer 122B, and laser beam 98 scanned to define and fill in the second layer while simultaneously bonding the second layer to the first. The process may be then repeated, as often as necessary, layer by layer, until base support 122 is completed. Platform 90 is then moved relative to the mirror 94 to form any additional base supports 122 on platform 90 or a substrate disposed thereon or to fabricate objects upon platform 90, base support 122, or a substrate, as provided in the control software. The number of layers required to erect support 122 or other objects to be formed depends upon the height of the object to be formed and the desired layer thickness 108, 110. The layers of a stereolithographically fabricated structure with a plurality of layers may have different thicknesses.

If a recoater blade 102 is employed, the process sequence is somewhat different. In this instance, surface 100 of platform 90 is lowered into unconsolidated (e.g., liquid) material 86 below surface level 88 a distance greater than a thickness of a single layer of material 86 to be cured, then raised above surface level 88 until platform 90, a substrate disposed thereon, or a structure being formed on platform 90 or a substrate is precisely one layer's thickness below blade 102. Blade 102 then sweeps horizontally over platform 90 or (to save time) at least over a portion thereof on which one or more objects are to be fabricated to remove excess material 86 and leave a film of precisely the desired thickness. Platform 90 is then lowered so that the surface of the film and material level 88 are coplanar and the surface of the unconsolidated material 86 is still. Laser 92 is then initiated to scan with laser beam 98 and define the first layer 130. The process is repeated, layer by layer, to define each succeeding layer 130 and simultaneously bond same to the next lower layer 130 until all of the layers of the object or objects to be fabricated are completed. A more detailed discussion of this sequence and apparatus for performing same is disclosed in U.S. Pat. No. 5,174,931, previously incorporated herein by reference.

As an alternative to the above approach to preparing a layer of material 86 for scanning with laser beam 98, a layer of unconsolidated (e.g., liquid) material 86 may be formed on surface 100 of support platform 90, on a substrate disposed on platform 90, or on one or more objects being fabricated by lowering platform 90 to flood material over surface 100, over a substrate disposed thereon, or over the highest completed layer of the object or objects being formed, then raising platform 90 and horizontally traversing a so-called "meniscus" blade horizontally over platform 90 to form a layer of unconsolidated material having the desired thickness over platform 90, the substrate, or each of the objects being formed. Laser 92 is then initiated and a laser beam 98 scanned over the layer of unconsolidated material to define at least the boundaries of the solid regions the next higher layer.

Yet another alternative to layer preparation of unconsolidated (e.g., liquid) material 86 is to merely lower platform 90 to a depth 87 equal to that of a layer of material 86 to be scanned, and to then traverse a combination flood bar and meniscus bar assembly horizontally over platform 90, a substrate disposed on platform 90, or one or more objects being formed to substantially concurrently flood material 86 thereover and to define a precise layer thickness of material 86 for scanning.

All of the foregoing approaches to liquid material flooding and layer definition and apparatus for initiation thereof are known in the art and are not material to practice of the present invention, so no further details relating thereto will be provided herein.

In practicing the present invention, a commercially available stereolithography apparatus operating generally in the manner as that described above with respect to apparatus 80 of FIG. 20 is preferably employed, but with further additions and modifications as hereinafter described for practicing the method of the present invention. For example and not by way of limitation, the SLA-250/50HR, SLA-5000 and SLA-7000 stereolithography systems, each offered by 3D Systems, Inc, of Valencia, Calif., are suitable for modification. Photopolymers believed to be suitable for use in practicing the present invention include Cibatool SL 5170 and SL 5210 resins for the SLA-250/50HR system, Cibatool SL 5530 resin for the SLA-5000 and 7000 systems, and Cibatool SL 7510 resin for the SLA-7000 system. All of these photopolymers are available from Ciba Specialty Chemicals Inc.

By way of example and not limitation, the layer thickness of material 86 to be formed, for purposes of the invention, may be on the order of about 0.0001 to 0.0300 inch, with a high degree of uniformity. It should be noted that different material layers may have different heights, so as to form a structure of a precise, intended total height or to provide different material thicknesses for different portions of the structure. The size of the laser beam "spot" or focal point 148 impinging on the surface of material 86 cure same may be on the order of 0.001 inch to 0.008 inch. Resolution is preferably ±0.0003 inch in the X-Y plane (parallel to surface 100) over at least a 0.5 inch×0.25 inch field from a center point, permitting a high resolution scan effectively across a 1.0 inch×0.5 inch area. Of course, it is desirable to have substantially this high a resolution across the entirety of surface 100 of platform 90 to be scanned by laser beam 98, such area being termed the "field of exposure," such area being substantially coextensive with the vision field of a machine vision system employed in the apparatus of the invention as explained in more detail below. The longer and more effectively vertical the path of laser beam 96/98, the greater the achievable resolution.

Referring again to FIG. 20, it should be noted that apparatus 80 useful in the method of the present invention includes a camera 140 which is in communication with computer 82 and preferably located, as shown, in close proximity to optics and scan controller 94 located above surface 100 of support platform 90. Camera 140 may be any one of a number of commercially available cameras, such as capacitive-coupled discharge (CCD) cameras available from a number of vendors. Suitable circuitry as required for adapting the output of camera 140 for use by computer 82 may be incorporated in a board 142 installed in computer 82, which is programmed as known in the art to respond to images generated by camera 140 and processed by board 142. Camera 140 and board 142 may together comprise a so-called "machine vision system" and, specifically, a "pattern recognition system" (PRS), operation of which will be described briefly below for a better understanding of the present invention. Alternatively, a self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guidance Package™ may be adapted to the present invention, although it is believed that the MVS-8000™ product family and the Checkpoints product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

Stereolithographic Fabrication of the Stabilizers

In order to facilitate fabrication of one or more stabilizers 50 in accordance with the method of the present invention with apparatus 80, a data file representative of the size, configuration, thickness and surface topography of, for example, a particular type and design of semiconductor device 10 or other substrate upon which one or more stabilizers 50 are to be mounted, is placed in the memory of computer 82. Also, if it is desired that the stabilizers 50 be so positioned on semiconductor device 10 taking into consideration features of substrate 20 (see FIG. 8), a data file representative of substrate 20 and the features thereof may be placed in memory.

One or more semiconductor devices 10, or a wafer 72 (see FIG. 19) including a large number of semiconductor devices 10 formed thereon, may be placed on surface 100 of platform 90 for fabrication of stabilizers 50 on one or more semiconductor devices 10. If one or more semiconductor devices 10, wafer 72, or another substrate is to be held on or supported above platform 90 by stereolithographically formed base supports 122, one or more layers of material 86 are sequentially disposed on surface 100 and selectively altered by use of laser 92 to form base supports 122.

Camera 140 is then activated to locate the position and orientation of each semiconductor device 10, including those of a wafer 72 (FIG. 19), or other substrate upon which stabilizers 50 are to be fabricated. The features of each semiconductor device 10 or wafer 72 are compared with those in the data file residing in memory, the locational and orientational data for each semiconductor device 10 then also being stored in memory. It should be noted that the data file representing the design size, shape and topography for each semiconductor device 10 may be used at this juncture to detect physically defective or damaged semiconductor devices 10 prior to fabricating stabilizers 50 thereon or before bonding such defective or damaged semiconductor device 10 to a substrate 20. Accordingly, such damaged or defective semiconductor devices 10 can be deleted from the process of fabricating stabilizers 50 or from assembly with a substrate 20. It should also be noted that data files for more than one type (size, thickness, configuration, surface topography) of each semiconductor device 10 may be placed in computer memory and computer 82 programmed to recognize not only the locations and orientations of each semiconductor device 10, but also the type of semiconductor device at each location upon platform 90 so that material 86 may be at least partially consolidated by laser beam 98 in the correct pattern and to the height required to define stabilizers 50 in the appropriate, desired locations on each semiconductor device 10.

Continuing with reference to FIGS. 20 and 21, the semiconductor device or devices 10 on platform 90 may then be submerged partially below the surface level 88 of liquid material 86 to a depth greater than the thickness of a first layer of material 86 to be at least partially consolidated (e.g., cured to at least a semisolid state) to form the lowest layer 130 of each stabilizer 50 at the appropriate location or locations on each semiconductor device 10, then raised to a depth equal to the layer thickness, surface 88 of material 86 being allowed to become calm. Photopolymers that are useful as material 86 exhibit a desirable dielectric constant, low shrinkage upon cure, are of sufficient (i.e., semiconductor grade) purity, exhibit good adherence to other semiconductor device materials, and have a sufficiently similar coefficient of thermal expansion (CTE) to the material of the conductive structures (e.g., solder or other metal or metal alloy). As used herein, the term "solder ball" may also be interpreted to encompass conductive or conductor filled epoxy. Preferably, the CTE of material 86 is sufficiently similar to that of the conductive structures to prevent undue stressing of the conductive structures or of semiconductor device 10 during thermal cycling thereof in testing and subsequent normal operation. One area of particular concern in determining resin suitability is the substantial absence of mobile ions and, specifically, of fluoride ions. Exemplary photopolymers exhibiting these properties are believed to include, but are not limited to, the above-referenced resins from Ciba Specialty Chemicals Inc.

Laser 92 is then activated and scanned to direct beam 98, under control of computer 82, toward specific locations of surface 88 relative to each semiconductor device 10 to effect the aforementioned partial cure of material 86 to form a first layer 50A of each stabilizer 50. Platform 90 is then lowered into reservoir 84 and raised a distance equal to the desired thickness of another layer 130 of each stabilizer 50, and laser 92 is activated to add another layer 130 to each stabilizer 50 under construction. This sequence continues, layer by layer, until each of the layers of stabilizers 50 have been completed.

In FIG. 21, the first layer 130 of stabilizer 50 is identified by numeral 50A, and the second layer 130 is identified by numeral 50B. Likewise, the first layer 130 of base support 122 is identified by numeral 122A, and the second layer 130 is identified by numeral 122B. As illustrated, both base support 122 and stabilizer 50 have only two layers 130, although the invention is not so limited.

Each layer 130 of stabilizer 50 is preferably built by first defining any internal and external object boundaries of that layer 130 with laser beam 98, then hatching solid areas of stabilizer 50 located within the object boundaries with laser beam 98. An internal boundary of a layer 130 may comprise a through-hole, a void, or a recess in stabilizer 50, for example. If a particular layer 130 includes a boundary of a void in the object above or below that layer 130, then laser beam 98 is scanned in a series of closely-spaced, parallel vectors so as to develop a continuous surface, or skin, with improved strength and resolution. The time it takes to form each layer 130 depends upon its geometry, the surface tension and viscosity of material 86, and the thickness of the layer.

Alternatively, stabilizers 50 may each be formed as a partially cured outer skin extending above active surface 14 of semiconductor device 10 and forming a dam within which unconsolidated material 86 can be contained. This may be particularly useful where the stabilizers 50 protrude a relatively high distance 54 from active surface 14. In this instance, support platform 90 may be submerged so that material 86 enters the area within the dam, raised above surface level 88, and then laser beam 98 activated and scanned to at least partially cure material 86 residing within the dam or, alternatively, to merely cure a "skin" comprising the contact surface 52, a final cure of the material of the stabilizers 50 being effected subsequently by broad-source UV radiation in a chamber, or by thermal cure in an oven. In this manner, stabilizers 50 of extremely precise dimensions may be formed of material 86 by apparatus 80 in minimal time.

Once stabilizers 50, or at least the outer skins thereof, have been fabricated, platform 90 is elevated above surface level 88 of material 86 and platform 90 is removed from apparatus 80, along with any substrate (e.g., semiconductor device 10 or wafer 72 (see FIG. 19)) disposed thereon and any stereolithographically fabricated structures, such as stabilizers 50. Excess, unconsolidated material 86 (e.g., uncured liquid) may be manually removed from platform 90, from any substrate disposed on platform 90, and from stabilizers 50. Semiconductor device 10 and stabilizers 50 thereon are removed from platform 90, such as by cutting semiconductor device 10 or stabilizers 50 free of base supports 122. Alternatively, stabilizers 122 may be configured to readily release semiconductor device 10, wafer 72, or another substrate. As another alternative, a solvent may be employed to release base supports 122 from platform 90. Such release and solvent materials are known in the art. See, for example, U.S. Pat. No. 5,447,822 referenced above and previously incorporated herein by reference.

Stabilizers 50 and semiconductor device 10 may also be cleaned by use of known solvents that will not substantially degrade, deform, or damage stabilizers 50 or a substrate to which stabilizers 50 are secured.

As noted previously, stabilizers 50 may then require postcuring. Stabilizers 50 may have regions of unconsolidated material contained within a boundary or skin thereof, or material 86 may be only partially consolidated (e.g., polymerized or cured) and exhibit only a portion (typically 40% to 60%) of its fully consolidated strength. Postcuring to completely harden stabilizers 50 may be effected in another apparatus projecting UV radiation in a continuous manner over stabilizers 50 or by thermal completion of the initial, UV-initiated partial cure.

It should be noted that the height, shape, or placement of each stabilizer 50 on each specific semiconductor device 10 may vary, again responsive to output of camera 140 or one or more additional cameras 144 or 146, shown in broken lines, detecting the protrusion of unusually high (or low) conductors which will affect the desired distance 54 that stabilizers 50 will protrude from active surface 14. In any case, laser 92 is again activated to at least partially cure material 86 residing on each semiconductor device 10 to form the layer or layers of each stabilizer 50.

Although FIGS. 20 and 21 illustrate the stereolithographic fabrication of stabilizers 50 on a substrate, such as a semiconductor device 10 or a wafer 72 including a plurality of semiconductor devices 10, stabilizers 50 can be fabricated on other types of substrates, such as substrate 20 (see FIG. 8). As another alternative, stabilizers 50 can be formed separately from a substrate, and subsequently adhered to a substrate (e.g., semiconductor device 10, wafer 72, or substrate 20) by known processes, such as by the use of a suitable adhesive material.

While a variety of methods may be used to fabricate stabilizers 50, the use of a stereolithographic process as exemplified above is a preferred method because a large number of stabilizers 50 may be fabricated in a short time, the stabilizer height and position are computer-controlled to be extremely precise, wastage of unconsolidated material 86 is minimal, solder coverage of passivation materials is reliably avoided through precise spacer height control, and the stereolithography method requires less handling of semiconductor devices 10 or other substrates than the other viable methods indicated above.

Stereolithography is also an advantageous method of fabricating stabilizers 50 according to the present invention since stereolithography can be conducted at substantially ambient temperature, the small spot size and rapid traverse of laser beam 98 resulting in negligible thermal stress upon the semiconductor devices 10, other substrates, or the features thereof.

Moreover, as disclosed herein, the stereolithography method of the present invention recognizes specific semiconductor devices 10 or other substrates, so that variations between individual substrates are accommodated. In addition, as shown in FIG. 8, each stabilizer 50 on each particular semiconductor device 10 or other substrate may be precisely positioned to match a desired "footprint" for stabilizers 50 on carrier substrate 20. The stereolithography fabrication process may also advantageously be conducted at the wafer level, saving fabrication time and expense.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method of modifying a semiconductor die, comprising:
   providing at least one semiconductor die having an active surface; and
   forming on or securing to the active surface at least one stabilizer comprising at least two superimposed, contiguous, mutually adhered layers comprising a dielectric material such that the at least one stabilizer protrudes from the active surface, the at least one stabilizer being configured to space the at least one semiconductor die a substantially fixed distance apart from a higher-level substrate when disposed active surface down over the higher-level substrate.

2. The method of claim 1, wherein forming the at least one stabilizer comprises forming a plurality of stabilizers.

3. The method of claim 2, wherein forming the plurality of stabilizers comprises forming at least one stabilizer of the plurality of stabilizers adjacent at least one corner of the active surface.

4. The method of claim 2, wherein forming the plurality of stabilizers comprises forming at least two stabilizers adjacent opposite peripheral edges of the active surface.

5. The method of claim 2, wherein forming the plurality of stabilizers comprises forming selected ones of the plurality of stabilizers to have a height that defines a substantially consistent die-to-substrate distance.

6. The method of claim 1, wherein forming the at least one stabilizer comprises forming the at least one stabilizer from photoimageable material.

7. The method of claim 1, wherein providing comprises providing at least one semiconductor die having a sealing material on an active surface thereof and wherein the forming comprises forming the at least one stabilizer to be securable to the sealing material.

8. The method of claim 1, wherein providing comprises providing a semiconductor wafer including a plurality of semiconductor dice.

9. The method of claim 1, further comprising adhering the at least one stabilizer to the active surface.

10. The method of claim 1, wherein forming the at least one stabilizer comprises applying a layer of insulative material on the active surface and patterning the layer.

11. The method of claim 1, wherein forming the at least one stabilizer comprises applying a layer of photoresist material on the active surface and patterning the layer.

12. The method of claim 1, further comprising introducing an encapsulant material between the at least one semiconductor die and the high-level substrate.

13. The method of claim 1, wherein forming the at least one stabilizer comprises positioning the at least one stabilizer on the active surface so as to avoid contact with conductive traces on a carrier substrate.

14. The method of claim 1, further comprising disposing at least one conductive structure on at least one bond pad of the at least one semiconductor die.

15. The method of claim 14, wherein disposing comprises forming a solder bump on the at least one bond pad.

16. The method of claim 14, wherein disposing comprises applying one of a conductive pillar, a conductor filled epoxy pillar, and a structure of z-axis elastomer to the at least one bond pad.

17. A method of modifying a semiconductor device component, comprising:
   providing at least one semiconductor substrate with contact pads on an active surface thereof; and
   sequentially forming on the active surface at least one stabilizer having a plurality of superimposed, contiguous, mutually adhered layers of photopolymer, the at least one stabilizer being configured to at least partially stabilize an orientation of the semiconductor device component upon being disposed active surface down over a higher-level substrate.

18. A method of modifying a semiconductor device component, comprising:
   placing at least one semiconductor substrate including at least one semiconductor die having an active surface with contact pads exposed thereon in a horizontal plane;
   recognizing a location and orientation of the at least one semiconductor die;
   stereolithographically forming on the active surface, between one of the contact pads and a peripheral edge of the at least one semiconductor substrate, at least one stabilizer comprising at least one layer of an electrically nonconductive semisolid material.

19. The method of claim 18, further comprising storing data including at least one physical parameter of the at least one semiconductor substrate in computer memory, and using the stored data in conjunction with a machine vision system to recognize the location and orientation of the at least one semiconductor substrate and to form the at least one stabilizer thereon.

20. The method of claim 19, further including in computer memory at least one parameter of another semiconductor device component to which the at least one semiconductor substrate is to be attached.

21. The method of claim 19, further comprising using stored data, in conjunction with the machine vision system, to selectively form the at least one layer of semisolid material stereolithographically on at least one portion of the active surface of the at least one semiconductor substrate.

22. The method of claim 19, further including securing the at least one semiconductor substrate to a carrier prior to placing the at least one semiconductor substrate in the horizontal plane.

23. A method for electrically bonding a semiconductor die having a surface and conductive structures protruding from the surface to a substrate having contacts positioned correspondingly to the conductive structures, the method comprising:
   stereolithographically forming at least one stabilizer structure comprising a dielectric material on at least one of the surface and the substrate for disposal between the surface and the substrate;
   inverting and positioning the semiconductor die on the substrate to contact the conductive structures to corresponding contacts; and
   bonding the conductive structures to the corresponding contacts.

24. The method of claim 23, wherein stereolithographically forming at least one stabilizer structure comprises forming the at least one stabilizer structure to have a height less than a minimum distance the conductive structures protrude from the surface.

25. The method of claim 23, wherein stereolithographically forming at least one stabilizer structure comprises forming the at least one stabilizer structure to space the surface from the substrate a distance greater than a minimum distance at least one of the conductive structures protrudes from the surface.

26. The method of claim 25, wherein bonding comprises employing the at least one stabilizer structure to lengthen at least one of the conductive structures.

27. The method of claim 23, wherein stereolithographically forming at least one stabilizer structure comprises configuring the at least one stabilizer structure to be positioned between a periphery of the surface of the semiconductor device die and the conductive structures.

28. A method of modifying a semiconductor die, comprising:
   providing at least one semiconductor die having an active surface with contact pads exposed thereon;
   applying a layer of a partially uncured photopolymer to the at least one semiconductor die; and
   stereolithographically forming on the at least one semiconductor die, between one of the contact pads and a peripheral edge of the at least one semiconductor die, at least one stabilizer securable to the active surface so as to protrude from the active surface, the at least one stabilizer being a structure configured to at least partially stabilize an orientation of the at least one semiconductor die when disposed active surface down over a higher-level substrate.

29. The method of claim 28, wherein forming the at least one stabilizer comprises forming a plurality of stabilizers.

30. The method of claim 29, wherein forming the plurality of stabilizers comprises forming at least one stabilizer of the plurality of stabilizers adjacent at least one corner of the active surface.

31. The method of claim 29, wherein forming the plurality of stabilizers comprises forming selected ones of the plurality of stabilizers to have a height that defines a substantially consistent die-to-substrate distance.

32. The method of claim 28, wherein providing comprises providing a semiconductor wafer including a plurality of semiconductor dice.

33. The method of claim 28, further comprising introducing an encapsulant material between the at least one semiconductor die and the higher-level substrate.

34. The method of claim 28, wherein forming the at least one stabilizer comprises positioning the at least one stabilizer on the active surface so as to avoid contact with conductive traces on a carrier substrate.

35. The method of claim 28, further comprising disposing at least one conductive structure on at least one bond pad of the at least one semiconductor die.

36. The method of claim 35, wherein disposing comprises forming a solder bump on the at least one bond pad.

37. A method for electrically bonding a semiconductor device component having a surface and conductive structures protruding from the surface to a substrate having contacts positioned correspondingly to the conductive structures, the method comprising:
   stereolithographically forming at least one stabilizer structure on at least one of the surface and the substrate for disposal between the surface and the substrate to space the surface from the substrate a distance greater than a minimum distance at least one of the conductive structures protrudes from the surface;
   inverting and positioning the semiconductor device component on the substrate to contact the conductive structures to corresponding contacts; and
   bonding the conductive structures to the corresponding contacts.

38. The method of claim 37, wherein stereolithographically forming at least one stabilizer structure comprises forming at least one stabilizer structure comprising dielectric material.

39. The method of claim 37, wherein bonding comprises employing the at least one stabilizer structure to lengthen at least one of the conductive structures.

40. The method of claim 37, wherein stereolithographically forming at least one stabilizer structure comprises configuring the at least one stabilizer structure to be positioned between a periphery of the surface of the semiconductor device component and the conductive structures.

* * * * *

UNITED STATES PATENT AND TRADEMARK OFFICE
CERTIFICATE OF CORRECTION

PATENT NO. : 7,041,533 B1
APPLICATION NO. : 09/590621
DATED : May 9, 2006
INVENTOR(S) : Salman Akram and Syed Sajid Ahmad It is certified that error appears in the above-identified patent and that said Letters Patent is hereby corrected as shown below:

On the title page:
ITEM (57) ABSTRACT change "face-down" to --face down--

In the specification:

| | | |
|---|---|---|
| COLUMN 1, | LINE 47, | change "state-of-the-art" to --state of the art-- |
| COLUMN 2, | LINE 3, | change "solder bumps 220A." to --conductor structures 220A, such as solder bumps.-- |
| COLUMN 2, | LINE 4, | change "solder bumps 220" to --conductor structures 220, such as solder bumps,-- |
| COLUMN 2, | LINE 24, | change "face-down" to --face down-- |
| COLUMN 2, | LINE 28, | after "along" and before "central" insert --the-- |
| COLUMN 2, | LINE 32, | change "face-down" to --face down-- |
| COLUMN 2, | LINES 66-67, | change "solder bumps 220." to --conductor structures 220, 220A.-- |
| COLUMN 2, | LINE 67, | change "solder bumps 220" to --conductor structures 220, such as solder bumps,-- |
| COLUMN 3, | LINE 2, | change "solder bumps 220" to --conductor structures 220, such as solder bumps,-- |
| COLUMN 3, | LINE 5, | change "bumps 220" to --conductor structures 220-- |
| COLUMN 3, | LINE 9, | change "active" to --active surface 204 and-- |
| COLUMN 3, | LINE 9, | change "solder bumps 220" to --conductor structures 220, such as solder bumps,-- |
| COLUMN 3, | LINE 20, | change "solder bumps 220" to --conductor structures 220, such as solder bumps,-- |
| COLUMN 3, | LINES 27-28, | change "solder bumps 220 or other conductive structures" to --conductor structures 220, such as solder bumps-- |
| COLUMN 3, | LINES 30-31, | change "solder bumps 220" to --conductor structures 220, such as solder bumps,-- |
| COLUMN 3, | LINE 32, | change "other" to --others-- |
| COLUMN 3, | LINE 33, | change "well known" to --well-known-- |
| COLUMN 3, | LINE 45, | change "edge, 226, 228, thereof" to --edge 226, 228 thereof-- |
| COLUMN 3, | LINES 47-48, | change "conductive structures such as solder bumps 220," to --conductor structures 220, such as solder bumps,-- |
| COLUMN 3, | LINES 58-59, | change "solder bumps 220" to --conductor structures 220A, such as solder bumps,-- |

UNITED STATES PATENT AND TRADEMARK OFFICE
CERTIFICATE OF CORRECTION

PATENT NO.         : 7,041,533 B1
APPLICATION NO. : 09/590621
DATED              : May 9, 2006
INVENTOR(S)        : Salman Akram and Syed Sajid Ahmad It is certified that error appears in the above-identified patent and that said Letters Patent is hereby corrected as shown below:

In the specification (continued):

| | | |
|---|---|---|
| COLUMN 4, | LINE 48, | change "previously-formed" to --previously formed-- |
| COLUMN 5, | LINE 26, | change "inventor's" to --inventors'-- |
| COLUMN 5, | LINE 50, | change "face-down" to --face down-- |
| COLUMN 11, | LINE 63, | after "stabilizers 50" and before "in situ" delete "can be fabricated" |
| COLUMN 11, | LINE 64, | after "device 10" and before "or" insert --or test substrate,-- |
| COLUMN 13, | LINE 3, | change "122. Such" to --122 (FIG. 21). Such-- |
| COLUMN 14, | LINE 14, | after "equal to" and before "thickness" insert --the-- |
| COLUMN 15, | LINE 38, | after "86" and before "cure" insert --to-- |
| COLUMN 15, | LINE 56, | change "optics and scan controller 94" to --mirror 94-- |
| COLUMN 16, | LINE 10, | change "Checkpoints" to --Checkpoint®- |
| COLUMN 18, | LINE 7, | after "surface level 88," and before "and" insert --88A, 88B-- |
| COLUMN 18, | LINE 29, | change "stabilizers 122" to --base supports 122-- |
| COLUMN 18, | LINE 54, | after "shown" and before "in broken" insert --in FIG. 20-- |

In the claims:

| | | |
|---|---|---|
| COLUMN 20, | LINE 22, | change "high-level" to --higher-level-- |
| COLUMN 21, | LINE 46, | before "die" delete "device" |

Signed and Sealed this

Thirteenth Day of November, 2007

JON W. DUDAS
*Director of the United States Patent and Trademark Office*